United States Patent
Kim et al.

(10) Patent No.: US 7,393,258 B2
(45) Date of Patent: Jul. 1, 2008

(54) METHOD OF INTEGRATING ORGANIC LIGHT EMITTING DIODE AND ORGANIC FIELD EFFECT TRANSISTOR

(75) Inventors: Seong Hyun Kim, Daejeon (KR); Tae Hyoung Zyung, Daejeon (KR); Jung Hun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 600 days.

(21) Appl. No.: 11/153,357

(22) Filed: Jun. 16, 2005

(65) Prior Publication Data

US 2006/0128250 A1      Jun. 15, 2006

(30) Foreign Application Priority Data

Dec. 9, 2004      (KR) ............... 10-2004-0103691

(51) Int. Cl.
*H01L 51/56* (2006.01)
(52) U.S. Cl. .............. 445/25; 445/24; 438/99; 438/22; 438/26
(58) Field of Classification Search ............ 445/24, 445/25; 438/22–26, 99
See application file for complete search history.

(56) References Cited

U.S. PATENT DOCUMENTS

| | | | |
|---|---|---|---|
| 5,970,318 A | 10/1999 | Choi et al. | |
| 6,150,668 A | 11/2000 | Bao et al. | |
| 6,175,345 B1 * | 1/2001 | Kuribayashi et al. | 313/506 |
| 6,524,884 B1 | 2/2003 | Kim et al. | |
| 6,548,961 B2 * | 4/2003 | Barth et al. | 313/506 |
| 2002/0158577 A1 * | 10/2002 | Shimoda et al. | 313/506 |
| 2003/0127972 A1 * | 7/2003 | Han et al. | 313/504 |
| 2004/0014251 A1 * | 1/2004 | Park et al. | 438/22 |

FOREIGN PATENT DOCUMENTS

| | | | |
|---|---|---|---|
| JP | 2007188704 A * | 7/2007 | |
| KR | 1020040015935 | 2/2004 | |
| KR | 1020040079476 | 9/2004 | |
| KR | 1020050051744 | 6/2005 | |
| KR | 2005115119 A * | 12/2005 | |

OTHER PUBLICATIONS

Notice of Allowance for Korean App. 10-2004-0103691.

* cited by examiner

*Primary Examiner*—Mariceli Santiago
(74) *Attorney, Agent, or Firm*—Lowe Hauptman Ham & Berner, LLP

(57) ABSTRACT

Provided is a method of integrating an organic light emitting diode (OLED) and an organic field effect transistor (OFET) including: preparing an organic field effect transistor including at least one first electrode and an organic semiconductor on a first substrate; preparing an organic light emitting diode including at least one second electrode and an organic emission layer on a second substrate; disposing the OFET and the OLED to make the first and second electrodes opposite to each other; inserting an insulating layer, to which a predetermined metal contact line for electrically connecting the first and second electrodes is securely fixed, between the OFET and the OLED; and adhering the OFET and the OLED to integrate them as one device, whereby it is possible to effectively perform active driving, to extend a lifetime due to a high aperture ratio, and to produce the device using a simple process at a low cost.

6 Claims, 1 Drawing Sheet

METHOD OF INTEGRATING ORGANIC LIGHT EMITTING DIODE AND ORGANIC FIELD EFFECT TRANSISTOR

CROSS-REFERENCE TO RELATED APPLICATION

This application claims the benefit of Korean Patent Application No. 2004-103691, filed Dec. 9, 2004, the disclosure of which is hereby incorporated herein by reference in its entirety.

BACKGROUND

1. Field of the Invention

The present invention relates to a method of integrating an organic light emitting diode (OLED) and an organic field effect transistor (OFET) for driving the OLED and, more particularly, to a method of integrating an organic light emitting diode (OLED) and an organic field effect transistor (OFET) capable of readily performing a process at a low cost by inserting an insulating layer, at which a predetermined metal contact line is formed, between the OLED and the OFET, and integrating the OLED and the OFET as one device.

2. Discussion of Related Art

In general, an OLED, which can emit light by itself, has been in the spotlight as a next generation display device following a liquid crystal display. Since its process is simple, the process can be performed at a normal temperature, and it is possible to manufacture the OLED on a crystalline substrate, a glass substrate, and a flexible plastic substrate, it is anticipated that the OLED will be variously applied and modified.

Meanwhile, although a conventional transistor can be manufactured on both of the crystalline substrate and non-crystalline substrate, it is difficult to be manufactured on the plastic substrate due to a high temperature required for the manufacture.

Therefore, in order to drive the OLED manufactured on the plastic substrate, it is required to use the OFET capable of performing the process at a normal temperature or a low temperature less than 100° C.

While the conventional art uses a metal ball for the purpose of electrical contact in order to implement a multi-layered device, since many metal lines are disposed at upper and lower substrates when the OLED is implemented as a concept of a panel other than a unit device, a short circuit may occur therebetween.

SUMMARY OF THE INVENTION

The present invention, therefore, solves aforementioned problems associated with conventional devices by providing a method of integrating an OLED and an OFET capable of readily performing a process at a low cost by inserting an insulating layer, at which a predetermined metal contact line is formed, between the OLED and the OFET, and integrating the OLED and the OFET as one device.

In an exemplary embodiment of the present invention, a method of integrating an organic light emitting diode (OLED) and an organic field effect transistor (OFET) includes: (a) preparing an organic field effect transistor including at least one first electrode and an organic semiconductor on a first substrate; (b) preparing an organic light emitting diode including at least one second electrode and an organic emission layer on a second substrate; (c) disposing the OFET and the OLED to make the first and second electrodes opposite to each other; (d) inserting an insulating layer, to which a predetermined metal contact line for electrically connecting the first and second electrodes is securely fixed, between the OFET and the OLED; and (e) adhering the OFET and the OLED to integrate them as one device.

In this process, the first and second substrates and the insulating layer may be made of one selected from a group consisting of plastic, fiber, and rubber.

The plastic may be made of one selected from a group consisting of polyester (PET), polycarbonate naphthalate (PEN), polyesthersulfone (PES) and polyimid (PI).

In the step (d), the metal contact line may be formed of one selected from a group consisting of Au, Ag, Cu, Al, Ni, Pd, Cr and their alloys containing at least one metal.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

Figure 1:
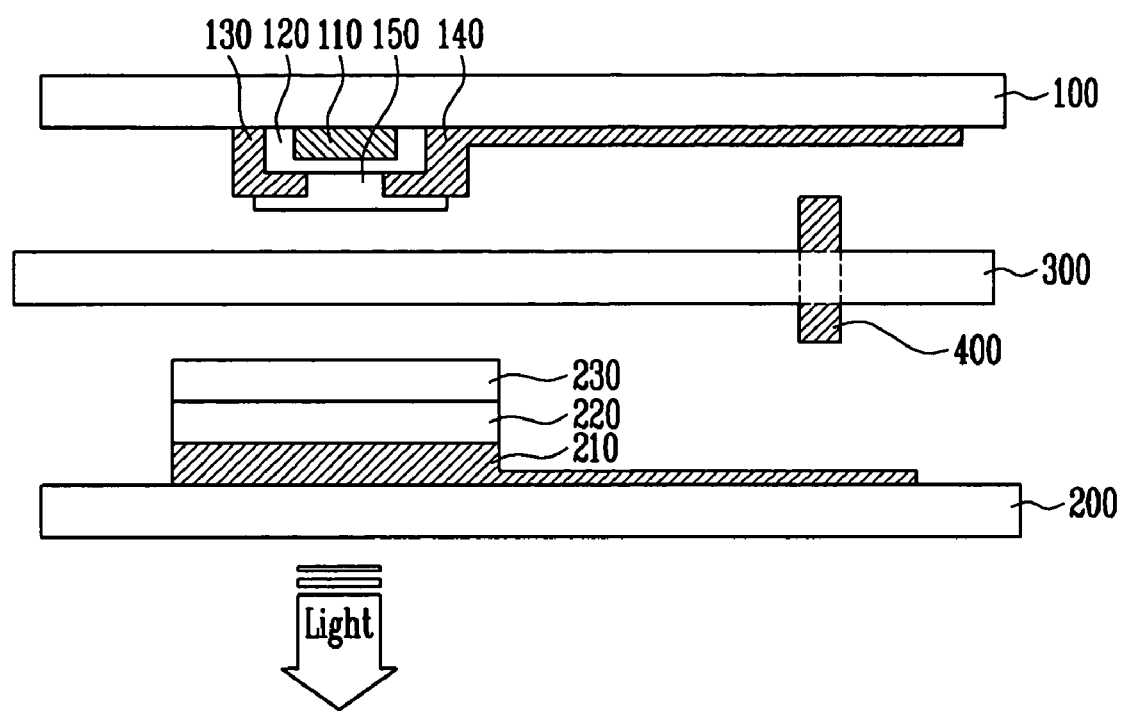
FIG. 1 is a schematic view illustrating a method of integrating an OFET and an OLED in accordance with an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

FIG. 1 is a schematic view illustrating a method of integrating an OFET and an OLED in accordance with an embodiment of the present invention.

Referring to FIG. 1, the present invention includes an OFET and an OLED.

In this process, the OFET includes a gate electrode 110 formed on a predetermined region of a substrate 100, a dielectric layer 120 formed on the substrate 100 and the gate electrode 110 to surround the gate electrode 110, source and drain electrodes 130 and 140 formed at both sides of the substrate 100 and the dielectric layer 120 to expose a portion of the dielectric layer 120, and an organic semiconductor 150 formed on portions of the exposed dielectric layer 120 and the source and drain electrodes 130 and 140.

The OLED includes a transparent electrode 210, an organic emission layer 220 and a metal electrode 230, which are sequentially formed on a substrate 200.

In order to make the OFET and the OLED as one integrated device, first, the OFET and the OLED formed on each of the substrates 100 and 200 are disposed opposite to each other. In this process, each electrode part, i.e., the drain electrode 140 and the transparent electrode 210 are disposed to be aligned to each other.

Next, when a panel is fabricated, a plastic film-shaped insulating layer 300 is inserted between the two substrates 100 and 200. At this time, the electrode parts, i.e., the drain electrode 140 and the transparent electrode 210 are in electrical contact with each other using a metal contact line 400 previously formed on the insulating layer 300. Finally, the OFET and the OLED are integrated as one device through a typical lamination process.

In addition, the metal contact line 400 is previously formed to be aligned with the OFET and the OLED, thereby adhering the OFET and the OLED to each other. Meanwhile, the metal contact line 400 may be adhered to the insulating layer 300 using an appropriate adhesive agent.

In this process, preferably, the substrates 100 and 200, and the insulating layer 300 are made of plastic, fiber, or rubber. At this time, preferably, the plastic is made of one selected from polyester (PET), polycarbonate naphthalate (PEN), polyesthersulfone (PES) and polyimid (PI).

In addition, preferably, the metal contact line 400 is formed of one selected from Au, Ag, Cu, Al, Ni, Pd, Cr and their alloys containing at least one metal.

As can be seen from the foregoing, the method of integrating an OFET and an OLED in accordance with the present invention is capable of readily performing a process at a low cost by inserting an insulating layer, at which a predetermined metal contact line is formed, between the OLED and the OFET, and integrating the OLED and the OFET as one device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of integrating an organic light emitting diode (OLED) and an organic field effect transistor (OFET), comprising:

(a) preparing the organic field effect transistor including at least one first electrode and an organic semiconductor on a first substrate;
   (b) preparing the organic light emitting diode including at least one second electrode and an organic emission layer on a second substrate;
   (c) disposing the OFET and the OLED to make the first and second electrodes opposite to each other;
   (d) inserting an insulating layer, to which a predetermined metal contact line for electrically connecting the first and second electrodes is securely fixed, between the OFET and the OLED; and
   (e) adhering the OFET and the OLED to integrate them as one device.

2. The method according to claim 1, wherein the first and second substrates and the insulating layer are made of one selected from a group consisting of plastic, fiber, and rubber.

3. The method according to claim 2, wherein the plastic is made of one selected from a group consisting of polyester (PET), polycarbonate naphthalate (PEN), polyesthersulfone (PES) and polyimid (PI).

4. The method according to claim 1, wherein, in the step (d), the metal contact line is formed of one selected from a group consisting of Au, Ag, Cu, Al, Ni, Pd, Cr and their alloys containing at least one metal.

5. The method according to claim 1, wherein, in the step (d), the insulating layer is formed in a plastic film shape.

6. The method according to claim 1, wherein, in the step (e), the OFET and the OLED are integrated as one device using a lamination process.

* * * * *